United States Patent [19]

Kato et al.

[11] Patent Number: 4,907,047

[45] Date of Patent: Mar. 6, 1990

[54] SEMICONDUCTOR MEMORY DEVICE

[75] Inventors: Takuya Kato; Mitsuru Sakamoto, both of Tokyo, Japan

[73] Assignee: NEC Corporation, Tokyo, Japan

[21] Appl. No.: 203,186

[22] Filed: Jun. 7, 1988

Related U.S. Application Data

[63] Continuation of Ser. No. 893,525, Aug. 6, 1986, abandoned.

[30] Foreign Application Priority Data

Aug. 9, 1985 [JP] Japan .................................. 60-175206

[51] Int. Cl.$^4$ .............................................. H01L 29/78
[52] U.S. Cl. .................... 357/23.6; 357/23.7; 357/59; 365/149
[58] Field of Search ..................... 357/23.6, 23.7, 59; 365/149

[56] References Cited

U.S. PATENT DOCUMENTS

| | | | |
|---|---|---|---|
| 4,381,202 | 4/1983 | Mori et al. ........................ | 357/23.7 |
| 4,432,006 | 2/1984 | Takei .................................. | 357/23.7 |

FOREIGN PATENT DOCUMENTS

| | | | |
|---|---|---|---|
| 167764 | 1/1986 | European Pat. Off. ............ | 357/23.6 |
| 55-140261 | 11/1980 | Japan .................................. | 357/23.6 |
| 60-136367 | 7/1985 | Japan .................................. | 357/23.6 |

*Primary Examiner*—Joseph E. Clawson
*Attorney, Agent, or Firm*—Sughrue, Mion, Zinn, Macpeak & Seas

[57] ABSTRACT

For improvement of signal-to-noise ratio and elimination of soft errors, there is disclosed a semiconductor memory device including a plurality of memory cells, each memory cell comprising a storage capacitor having a first electrode formed in side and bottom wall portions defining a primary cavity opened at a major surface of a semiconductor substrate, a thin dielectric film covering the side and bottom wall portions and substantially dictated by the configuration of the side and bottom wall portions to define a secondary cavity, and a second electrode filling the secondary cavity and projecting from the major surface of the semiconductor substrate, a thick insulating layer covering the major surface of the semiconductor substrate and formed therein an opening substantially aligned with the secondary cavity to allow the second electrode to extend over the surface of the thick insulating layer, and a switching transistor provided on the thick insulating layer and having source/ drain regions separated from each other by a channel region, one of the source/ drain regions being connected to the second electrode, a thin dielectric film formed on the channel region, and a gate electrode formed on the thin dielectric film.

6 Claims, 9 Drawing Sheets

SEMICONDUCTOR MEMORY DEVICE

This is a continuation of application Ser. No. 893525 filed Aug. 6, 1986, abandoned.

FIELD OF THE INVENTION

This invention relates to a semiconductor memory device and, more particularly, to a memory cell structure capable of storing a binary data in the form of electric charge.

BACKGROUND OF THE INVENTION

There is an increasing interest in the electronics industry in a high-density memory cell device. Research and development efforts are being therefore made for dynamic random access memory devices using one switching transistor and one storage capacitor structure which is considered to be the feasible approach to increase the memory cell density. However, there are still many problems to implement a ultra-high-density memory device on a single semiconductor chip. For better understanding of the features and advantages of a semiconductor memory device according to the present invention over prior-art semiconductor memory devices, description will be hereinafter made with reference to FIG. 1 which shows a typical example of a storage capacitor incorporated in the prior-art memory cell of the semiconductor memory device. The storage capacitor basically comprises a lower electrode 1 formed in a major surface region of a p-type reverse-biased semiconductor substrate 2, a thin dielectric film 3 of, for example, silicon dioxide which is thermally grown in an oxidation ambient, and an upper electrode 4 of, for example, polysilicon. Though not shown in FIG. 1, the storage capacitor is arranged to be contiguous to an access transistor to form in combination a memory cell capable of storing either binary data in the form of electric charge. When the memory cell consisting of the storage capacitor shown in FIG. 1 and the associated access transistor (not shown) is accessed from an external device such as a microprocessor, the associated access transistor turns on to allow electric charges to flow in (write mode) or flow out (read mode) across the switching transistor and thereafter turns off to maintain the electric charges in the storage capacitor.

The prior-art memory cell structure has a problem in soft errors. On the completion of fabricating the memory cell array and peripheral circuits on the semiconductor substrate 2, the semiconductor chip is assembled and packaged for completion of the memory cell device. The packaging materials contain some impurities such as uranium and thorium atoms which produce $\alpha$-particles emitted by the decay thereof. These $\alpha$-particles in turn produce electrons and holes during the penetrations through the semiconductor substrate 2 as well as projections of another charged particle. As illustrated in FIG. 1, the substrate 2 is biased to a negative voltage level, only the holes produced by the $\alpha$-particles and another charged particle are attracted to the negative voltage source, then remaining the electrons in the semiconductor substrate 2. The remaining electrons cause the binary data stored in the memory cell to be destroyed. In order to prevent the binary data stored in the memory cell from destruction caused by the $\alpha$-particles, it is necessary to use a high quality packaging material or to apply an $\alpha$-absorbing coating over the memory cell array. However, these solutions increase the production cost and has problems in complexity in the process of device fabrication.

A trench capacitor is seen in "BURIED STORAGE ELECTRODE (BSE) CELL FOR MEGABIT DRAMS", IEDM Technical Digest 1985, pp. 710 to 713, but this paper has been written by authors including the inventor.

The present invention contemplates elimination of these problems inherent in the prior-art memory cell device.

SUMMARY OF THE INVENTION

In accordance with the present invention, there is provided a semiconductor memory device including a plurality of memory cells, each memory cell comprising (1) a storage capacitor having a first electrode formed in side and bottom wall portions defining a primary cavity opened at a major surface of a semiconductor substrate, a thin dielectric film covering the side and bottom wall portions and substantially dictated by the configuration of the side and bottom wall portions to define a secondary cavity, and a second electrode filling the secondary cavity and projecting from the major surface of the semiconductor substrate, (2) a thick insulating layer covering the major surface of the semiconductor substrate and having formed therein an opening substantially aligned with the secondary cavity to allow the second electrode to extend over the surface of the thick insulating layer, and (3) a switching transistor provided on the thick insulating layer and having source/drain regions separated from each other by a channel region, one of the source/drain regions being connected to the second electrode, a thin dielectric film formed on the channel region, and a gate electrode formed on the thin dielectric film. In a preferred embodiment of the semiconductor memory device thus arranged, the thick insulating layer further has an opening which allows the channel region of the switching transistor to extend to the major surface of the semiconductor substrate.

BRIEF DESCRIPTION OF THE DRAWINGS

The features and advantages of a semiconductor memory device according to the present invention will be more clearly understood from the following description taken in conjunction with the accompanying drawings in which.

BRIEF DESCRIPTION OF THE PREFERRED EMBODIMENT

Figure 1:
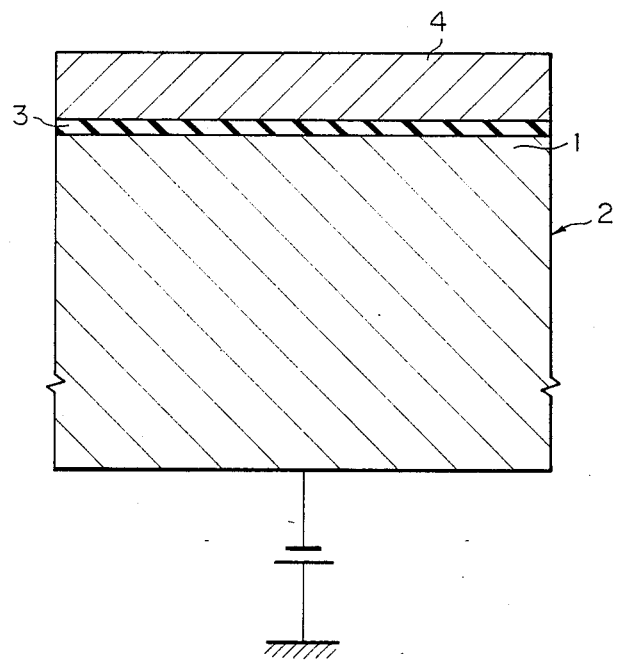
FIG. 1 is a cross sectional view showing a storage capacitor forming part of a prior-art semiconductor memory cell.
Figure 2:
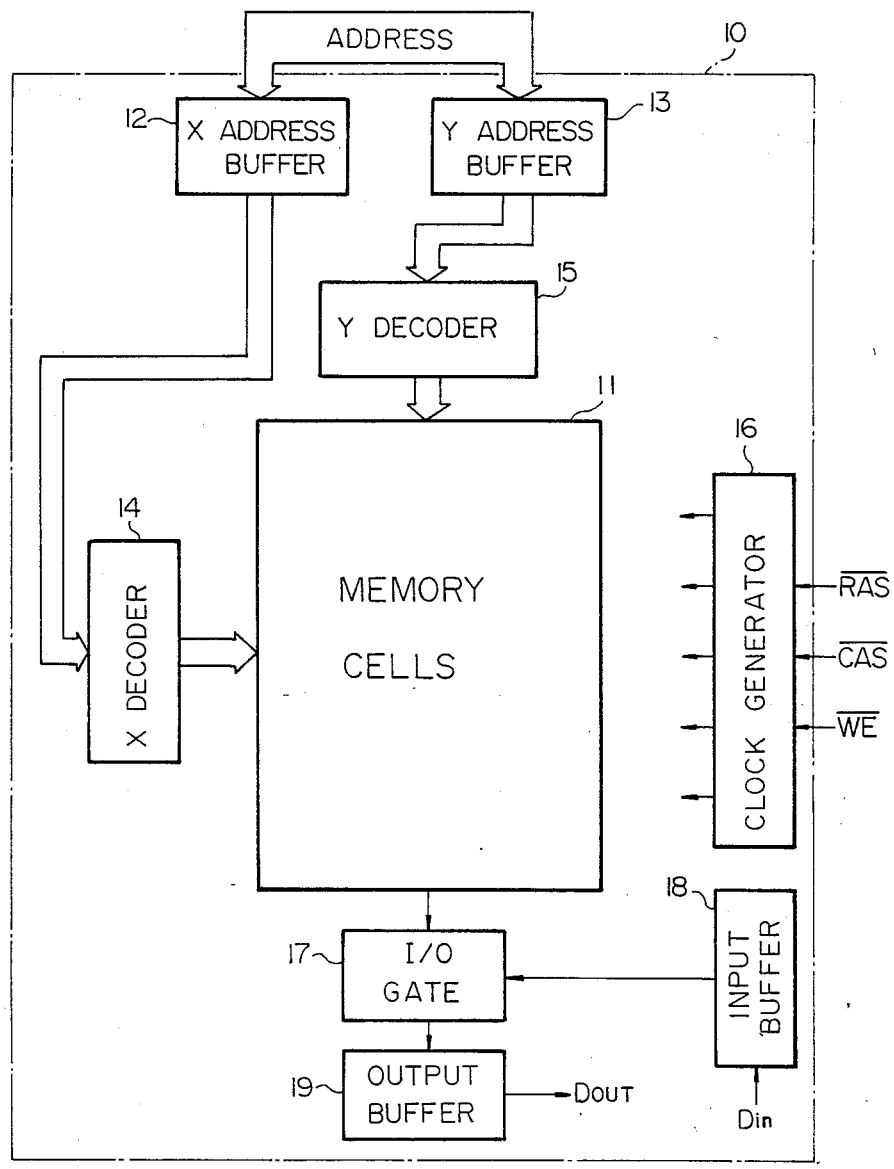
FIG. 2 is a block diagram showing a semiconductor memory device to which the present invention appertains.
Figure 3A:
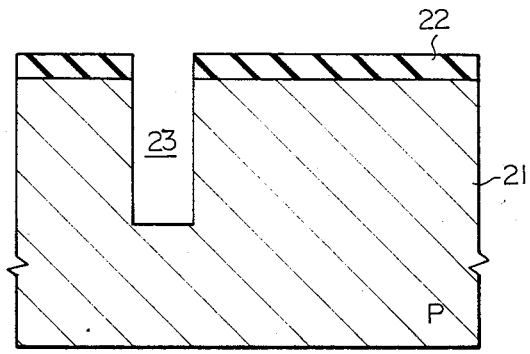
FIGS. 3 (A) to (E) are cross sectional views showing a series of process steps to be performed to fabricate a first preferred embodiment of the semiconductor memory device according to the present invention.
Figure 3B:
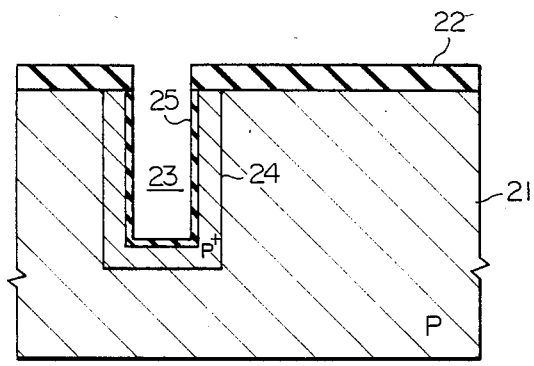
Figure 3C:
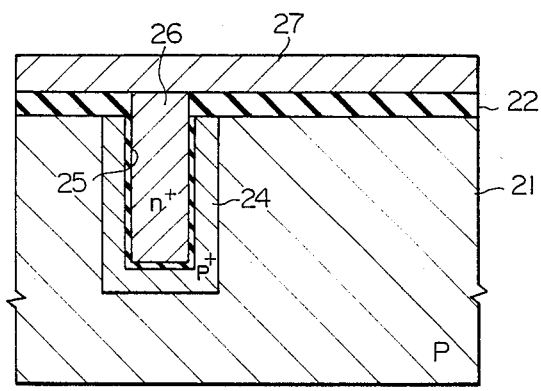
Figure 3D:
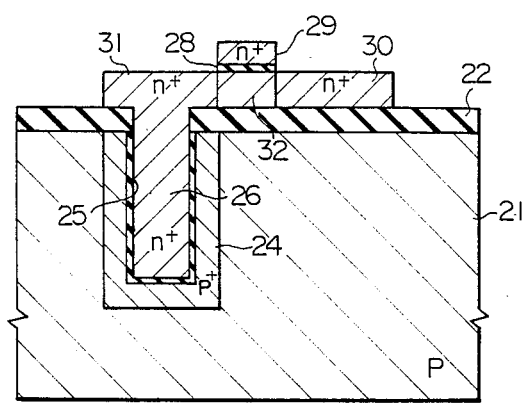
Figure 3E:
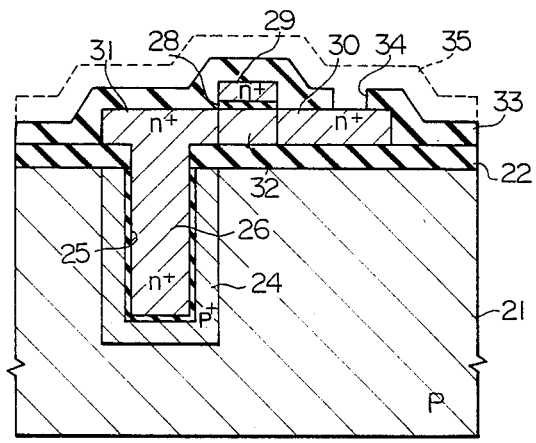

Referring to FIG. 2 of the drawings, there is shown a semiconductor random access memory device to which the present invention appertains. The random access memory device is realized on a single semiconductor chip the boundary of which is indicated by a dot-and-dash line 10. On the semiconductor chip are fabricated a plurality of memory calls 11 arranged in rows and columns and peripheral circuits which basically comprise an X address buffer 12, a Y address buffer 13, an X decoder 14, a Y decoder 15, a clock generator 16, an I/O gate 17, an input buffer 18, and an output buffer 19. Though not shown in FIG. 2, the X and Y address buffers 12 and 13 are connected to a set of address pins of, for example, a microprocessor which provides an address signal on the set of address pins to specify a memory cell for access. The input and output buffers 18 and 19 are also connected to data pins of the microprocessor to receive or supply a binary data Din or Dout, and the clock generator 16 is supplied with control signals such as row address strobe signal $\overline{RAS}$, column address strobe signal $\overline{CAS}$ and write enable signal $\overline{WE}$ from control pins of the microprocessor to produce a series of clock signals to control the sequence of operations. The semiconductor memory device thus arranged is capable of storing either binary data each in the form of electric charge and is accessible by an external device such as the microprocessor for writing or reading out the binary data.

Description of a memory cell structure according to the present invention will be made with reference to the drawings.

First Embodiment

Referring to FIGS. 3 (A) to (E) of the drawings, there are shown a series of process steps to be performed to fabricate a first embodiment of the memory cell according to the present invention. The process to fabricate the memory cell structure starts with the preparation of a semiconductor substrate 21 of, for example, a p-type silicon with a resistivity of about 1.0 $\Omega$-cm. The silicon substrate 21 is thermally oxidated to form a thick silicon oxide layer 22, then a photoresist film is applied to the entire surface of the silicon oxide layer 22. The photoresist film thus applied to the entire surface of the silicon oxide layer 22 is patterned and selectively removed to form a mask allowing an etched portion of the silicon oxide 22 to be exposed, and the exposed etched portion of the silicon oxide 22 and the semiconductor substrate 21 underneath the etched portion are selectively removed to form a trench 23 with a depth of about 5 to 6 microns and a width of about 1 micron by anisotropic etching techniques typically reactive ion etching using chlorine-containing gases such as, for example, $CCl_4$. On the completion of the anisotropic etching, the trench 23 is formed in the semiconductor substrate 21 and opened at the upper surface of the silicon oxide 22 as will be seen in FIG. 3 (A).

In order to increase the dopant concentration of the side and bottom portions 24 which define the trench 23, boron atoms are introduced therein by diffusion techniques, thereby forming an inner electrode of the storage capacitor. After the formation of the inner electrode, a thin silicon oxide film 25 is deposited on the entire side and bottom wall portions 24 to form a dielectric film of the storage capacitor. In this instance, the dielectric film of the storage capacitor is formed by the silicon oxide 25, but a silicon nitride film or a composite film structure thereof is applicable to form the dielectric film. The resultant structure is shown in FIG. 3 (B).

A deposition process of polysilicon follows. The polysilicon is doped by addition of n-type dopant gases during deposition (in-situ doping) and deposited to a thickness greater than the width of the trench 23 to fill the trench 23 with the doped polysilicon 26. Amorphous silicon may be used instead of the doped polysilicon 26. The doped polysilicon on the silicon oxide 22 is removed by, for example, reactive ion etching techniques, but the doped polysilicon 26 remains in the trench 23 to form a capacitor electrode of the storage capacitor, the upper surface of which is substantially coplanar with the upper surface of the silicon oxide 22. After the formation of the capacitor electrode of the storage capacitor, undoped polysilicon 27 is deposited on the entire surface of the resultant structure by chemical vapor deposition techniques (CVD) as will be seen from FIG. 3 (C).

On the entire surface of the undoped polysilicon layer 27 is formed a thin oxide film on which a doped polysilicon film in turn is deposited. Then, the multi-layered thin oxide film and the doped polysilicon are patterned and etched to form a gate oxide film 28 and a gate electrode 29 of the switching transistor forming part of the memory cell. The gate electrode 29 is electrically connected to one of word lines which is selected by the X decoder 15 (FIG. 2) based on the address signal applied from the external microprocessor. After the formation of the gate electrode 29, the polysilicon 27 is doped with arsenic atoms using the gate electrode 29 as a mask, and is then patterned and etched by typical lithography techniques to form source and drain regions 30 and 31 of the switching transistor. The source region 30 is electrically connected to a sense amplifier circuit (not shown) through a bit line to judge the binary value of the stored data in the accessed storage capacitor. On the other hand, the drain region 31 continues to the capacitor electrode of the storage capacitor formed by the doped polysilicon. However, the arsenic atoms are not introduced into the channel region 32 intervening between the source and drain regions 30 and 31, and, for this reason, the switching transistor operates in the depletion mode. In this instance, the impurity doping is performed by ion implantation techniques, however doped polysilicon is also used. The resultant structure is illustrated in FIG. 3 (D).

An insulating layer 33 of, for example, silicon dioxide or phosphosilicate glass is deposited on the entire surface of the resultant structure and thereafter selectively removed to form contact windows including a contact window 34 on the source region 30 of the switching transistor. A layer of aluminum 35 is deposited on the insulating layer 33 and has lug portions one of which reaches the surface of the source region 30 through the contact window 34. Though not shown in the drawings, a suitable photoresist film is applied on the surface of the aluminum layer 35 and then patterned and selectively removed to form a mask for following etching process. The aluminum layer 35 is then selectively removed using the photoresist mask formed during the previous step, thereby forming a wiring metal layer. The resultant structure is shown in FIG. 3 (E) of the drawings.

Second Embodiment

Figure 4:
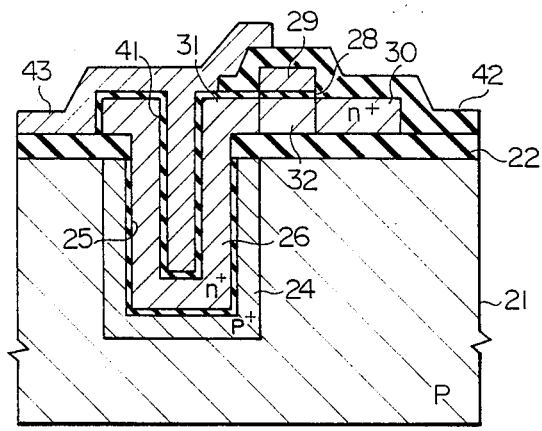
FIG. 4 is a cross sectional view showing a second preferred embodiment of the semiconductor memory device according to the present invention.
Figure 5A:
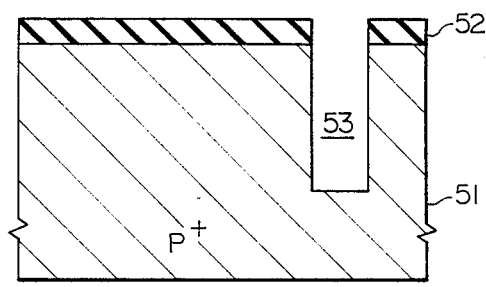
FIGS. 5 (A) to (G) are cross sectional views showing a series of process steps to be performed to fabricate the third preferred embodiment of the present invention.
Figure 5B:
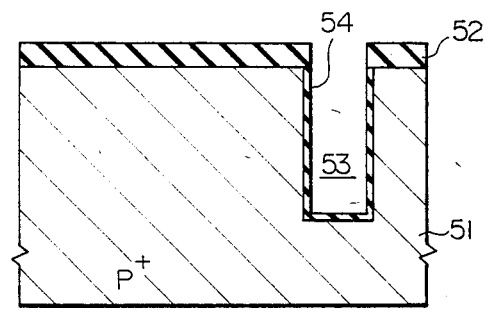
Figure 5C:
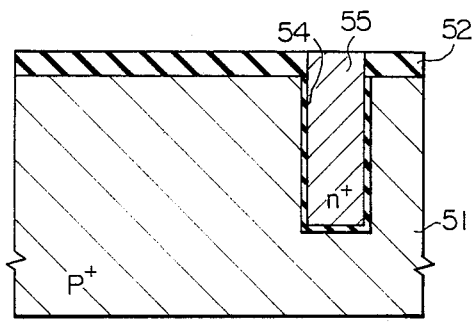
Figure 5D:
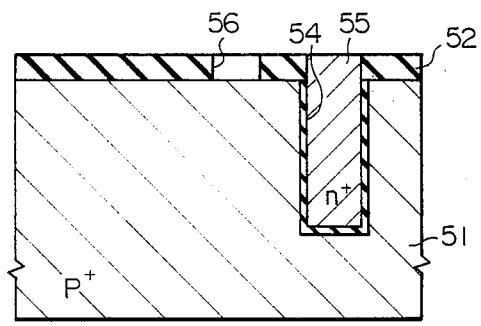
Figure 5E:
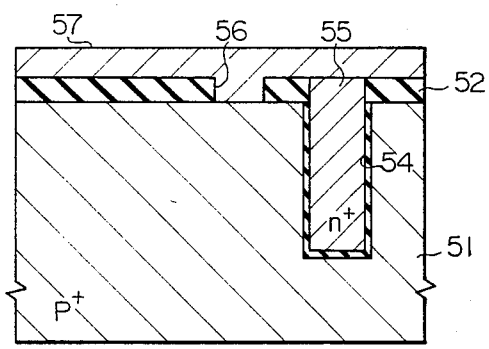
Figure 5F:
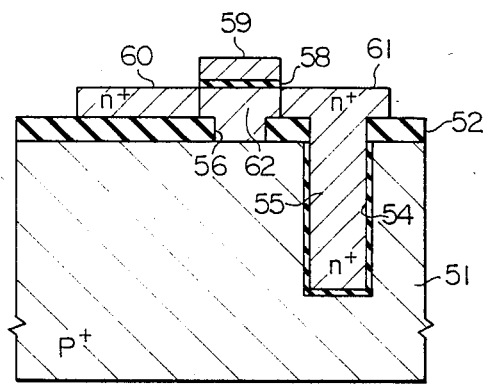
Figure 5G:
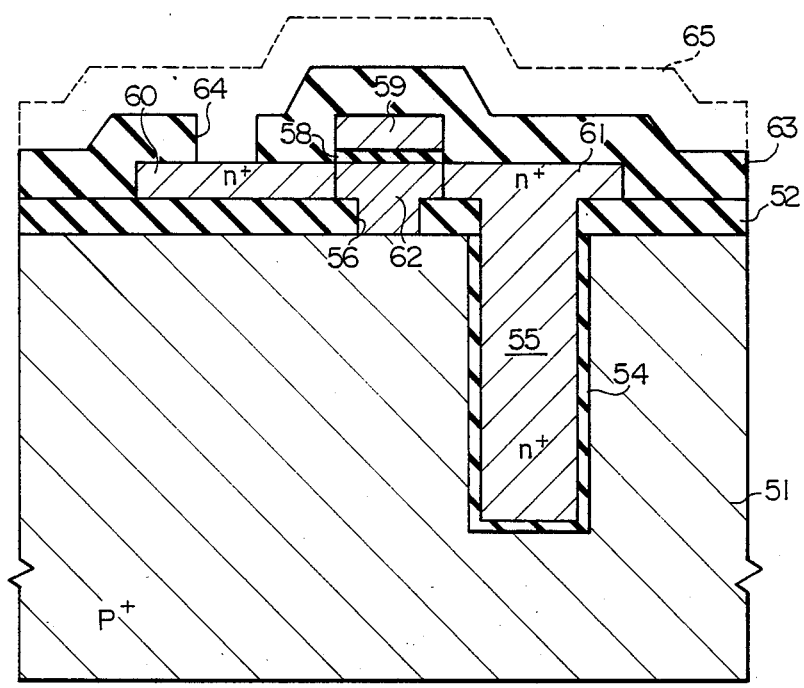

Turning to FIG. 4 of the drawings, there is shown a second preferred embodiment of the present invention, in which like reference numerals used in FIG. 3 (A) through (E) designate corresponding substrate, portions, layers and films. A narrow groove is formed in the doped polysilicon 26 by anisotropic etching techniques, typically reactive ion etching using chlorine-containing gases such as, for example, CCl4 after the formation of the source and drain regions 30 and 31 with a high dopant concentration. After the formation of the narrow groove, the deposition of the thin oxide film follows to cover not only the entire surface of the patterned undoped polysilicon layer 27 but also the inner surface of the doped polysilicon 26 defining the narrow groove, thereby forming a dielectric film 41 covering the entire surface of the capacitor electrode together with the dielectric film 25. After the gate electrode 29 is covered with an insulating layer 42 of such as, for example, silicon oxide, a metal layer of, for example, molybdenum or tungsten is deposited on the entire surface of the structure and is patterned and etched to form a metal electrode 43 which has a lug portion extending in the narrow groove in the doped polysilicon. The second embodiment of the memory cell thus formed has an increased capacitor area approximately twice as large as that of the first embodiment illustrated in FIGS. 3 (A) to (E).

THIRD EMBODIMENT

Description is hereinafter made with reference to FIGS. 5 (A) to (G) which show a series of process steps to be performed to fabricate a third preferred embodiment of the memory call according to the present invention.

The process to fabricate the memory cell structure starts with the preparation of a semiconductor substrate 51 of, for example, a p-type silicon with a resistivity of about 0.01 $\Omega$-cm. The silicon substrate 51 is thermally oxidated to form a thick silicon dioxide layer 52, then a photoresist film is applied to the entire surface of the silicon dioxide layer 52. The photoresist film thus applied to the entire surface of the silicon dioxide layer 52 is patterned and selectively removed to form a mask allowing an etched portion of the silicon dioxide 52 to be exposed, and the exposed etched portion of the silicon dioxide 52 and the semiconductor substrate 51 underneath the etched portion are selectively removed to form a trench 53 with a depth of about 5 microns and a width of about 1 micron by anisotropic etching techniques, typically reactive ion etching using chlorine-containing gases such as, for example, CCl4. On the completion of the anisotropic etching, the trench 53 is formed in the semiconductor substrate 51 and opened at the upper surface of the silicon dioxide 52 as will be seen in FIG. 5 (A).

After the formation of the trench 53 by the anisotropic etching process, a silicon oxide film 54 is deposited on the entire side and bottom wall portions of the substrate to form a dielectric film of the storage capacitor. In this instance, the dielectric film of the storage capacitor is formed by the silicon oxide film 54, but a silicon nitride film or a composite film structure thereof is applicable to form the dielectric film. The resultant structure is shown in FIG. 5 (B).

A deposition process of polysilicon follows. The polysilicon is doped by addition of n-type dopant gases during deposition (in-situ doping) and deposited to a thickness greater than the width of the trench 53 to fill the trench 53 with the doped polysilicon 55. The doped polysilicon 55 on the silicon dioxide film 52 is removed by, for example, reactive ion etching techniques, but the doped polysilicon 55 remains in the trench 53 to form a capacitor electrode of the storage capacitor, the upper surface of which is substantially coplanar with the upper surface of the silicon dioxide film 52 as will be seen from FIG. 5 (C).

After the formation of the capacitor electrode of the storage capacitor, a photoresist film is applied to the entire surface of the resultant structure shown in FIG. 5 (C) and then is patterned and selectively removed by usual lithography techniques to provide a mask layer for the subsequent step. After the provision of the mask layer, the silicon dioxide film 52 is selectively removed to form a contact window 56 which allows the surface of the silicon dioxide 52 partially to be exposed as shown in FIG. 5 (D) of the drawings. The contact window 56 is arranged in such a manner as to be in the vicinity of the capacitor electrode formed by the doped polysilicon 55.

The photoresist mask is then stripped off and a single crystal silicon layer 57 is epitaxially grown from the exposed silicon substrate 51 to the extent that the entire surface of the silicon dioxide 52 is covered with the single crystal silicon layer 57 of a preselected thickness. However, a polysilicon layer or an amorphous silicon layer may be applicable instead of the single crystal silicon layer 57, and those layers can be deposited by a usual CVD process. When a CVD process is employed to form the source, drain and channel regions of the switching transistor, a single crystal portion may be provided for the channel region but polysilicon regions for the source and drain regions. The resultant structure of this step is illustrated in FIG. 5 (E).

On the entire surface of the single crystal silicon layer 57 is formed a thin oxide film on which a doped polysilicon film in turn is deposited. Then, the multi-layered thin oxide film and the doped polysilicon are patterned and etched to form a gate oxide film 58 and a gate electrode 59 of the switching transistor forming part of the memory cell. The gate electrode 59 is electrically connected to one of word lines which is selected by the X decoder 15 (FIG. 2) based on the address signal supplied from the external microprocessor. The gate electrode 59 is arranged in such a manner as to be located above the contact opening 56. After the formation of the gate electrode 59, the single crystal silicon layer 57 is doped with arsenic atoms using the gate electrode 59 as a mask, and is then patterned and etched by usual lithography techniques to form source and drain regions 60 and 61 of the switching transistor. The source region 60 is electrically connected to a sense amplifier circuit (not shown) through a bit line to judge the binary value of the stored data in the accessed storage capacitor. On the other hand, the drain region 61 continues to the capacitor electrode of the storage capacitor formed by the doped polysilicon. However, the arsenic atoms are not introduced into the channel region 62 intervening between the source and drain regions 60 and 61 which contacts to the surface of the silicon substrate 51 through the contact window 56, and, for this reason, the channel region 62 has a voltage level approximately equal to that of the silicon substrate 51, thereby preventing the channel region from undesirable electric paths which are causative of the leakage current from the storage capacitor. The resultant structure is illustrated in FIG. 5 (F).

An insulating layer 63 of, for example, silicon oxide or phosphosilicate glass is deposited on the entire surface of the resultant structure and thereafter selectively removed to form contact windows including a contact window 64 on the source region 60 of the switching transistor. A layer of aluminum 65 is deposited on the insulating layer 63 and has lug portions one of which reaches the surface of the source region 60 through the contact window 64. Though not shown in the drawings, a suitable photoresist film is applied on the surface of the aluminum layer 65 and then patterned and selectively removed to form a mask for following etching process. The aluminum layer 65 is then selectivelythen patterned and selectively removed to form a mask for following etching process. The aluminum layer 65 is then selectivelythen patterned and selectively removed to form a mask for following etching process. The aluminum layer 65 is then selectivelythen patterned and selectively removed to form a mask for following etching process. The aluminum layer 65 is then selectively removed using the photoresist mask formed during the previous step, thereby forming a wiring metal layer. The resultant structure is shown in FIG. 5 (G) of the drawings.

As will be understood from the foregoing description, the memory cell structure according to the present invention is advantageous over the prior-art. The storage capacitor according to the present invention has the capacitor electrode along the side and bottom wall portions of the substrate which define the trench. This results in an increased capacitance of the storage capacitor in the original occupation of the horizontal projective area on the major surface of the substrate. Further, the bit lines, one of which is electrically connected to the source region of the switching transistor, extend on the thick silicon oxide film so that the parasitic capacitance form between each bit line and the semiconductor substrate has a relatively small value in comparison with the prior-art memory cell structure. Therefore, it is possible to reduce the memory cell size without deterioration in signal-to-noise ratio.

Moreover, the capacitor electrode of the storage capacitor is electrically isolated from the semiconductor substrate by means of the dielectric film, and, for this reason, the electrons and holes produced by the α-particles are recombined in the doped polysilicon providing the capacitor electrode without flowing into the substrate even if the semiconductor substrate is biased to the negative voltage level. Further, the data is stored in the respective capacitor electrode encircled by the dielectric film in the form of electric charge so that the stored data does not interfere with the data stored in the adjacent memory cell even if the interval between the memory cells is decreased. For this reason, the present invention is conductive to increasing the memory cell density.

As to the third embodiment of the memory cell structure shown in FIGS. 5 (A) to (G), the switching transistor has the channel region contacting the semiconductor substrate so that the channel region has an approximately identical potential level with the semiconductor substrate. By virtue of establishment of electric contact between the channel region and the silicon substrate, it is possible to minimize a leakage current appearing along the boundary between the channel region and the thick oxide layer, and, for this reason, the electric charges representative of the stored data do not flow out from the storage capacitor, thereby being possible to keep the stored data for a long time period.

What is claimed is:

1. A semiconductor memory device including a plurality of memory cells, each of said memory cells comprising:
   a semiconductor substrate which is heavily doped with an impurity of a first conductivity type and having a major surface and a primary cavity formed in said major surface, said primary cavity having side and bottom portions;
   a storage capacitor having a first electrode formed by said side and bottom wall portions defining said primary cavity, a first thin dielectric film covering the side and bottom wall portions and having a geometry substantially dictated by the configuration of the side and bottom wall portions to define a secondary cavity, and a second electrode filling the secondary cavity and projecting from the major surface of the semiconductor substrate, said first electrode being heavily doped with said impurity of said first conductivity type, and said second electrode being formed of a semiconductor material which is doped with a second, opposite conductivity type;
   a thick insulating layer convering the major surface of the semiconductor substrate and having formed therein a first opening substantially aligned with the secondary cavity to allow the second electrode to extend beyond the surface of the thick insulating layer, said thick insulating layer having a flat surface extending along an upper surface thereof; and
   a switching transistor provided on the thick insulating layer and comprising an epitaxial semiconductor layer formed in part on said thick insulating layer and electrically coupled to said second electrode, part of said semiconductor layer constituting source and drain regions and a channel region which separates said source and drain regions from each other, each of said source and drain regions being doped with an impurity of said second conductivity type, boundaries between said channel region and said source and drain regions being located on said flat surface, said switching transistor further comprising a second thin dielectric film formed on the channel region, and a gate electrode formed on the second thin dielectric film, one of the source and drain regions being connected to the second electrode of the storage capacitor, said thick insulating layer having a second opening through which said channel region extends to said major surface of said semiconductor substrate.

2. A semiconductor memory device as set forth in claim 1, in which the semiconductor layer is formed of a semiconductor material selected from the group consisting of amorphous silicon, polysilicon and single crystal silicon.

3. A semiconductor memory device as set forth in claim 1, wherein said impurity of said first conductivity type is boron.

4. A semiconductor memory device as set forth in claim 1, wherein said impurity of said second conductivity type is arsenic.

5. A semiconductor memory device as set forth in claim 1, wherein said first thin dielectric film is selected from the group consisting of silicon oxide, silicon nitride, and a composite dielectric film.

6. A semiconductor memory device as set forth in claim 1, in which all of said source, drain and channel regions are formed of an epitaxial semiconductor material.

* * * * *

UNITED STATES PATENT AND TRADEMARK OFFICE
CERTIFICATE OF CORRECTION

PATENT NO. : 4,907,047

DATED : March 6, 1990

INVENTOR(S) : Takuya Kato et al.

It is certified that error appears in the above-identified patent and that said Letters Patent is hereby corrected as shown below:

Column 3, line 4, delete "calls" and insert --cells--.

Column 7, lines 7-8, delete "selectivelythen patterned and".

Column 7, line 8, after "removed" delete the remaining part of line 8 and delete lines 9-14;

line 15, delete "removed".

Signed and Sealed this

Fourteenth Day of May, 1991

Attest:

HARRY F. MANBECK, JR.

Attesting Officer

Commissioner of Patents and Trademarks